United States Patent [19]
Yamamoto et al.

[11] Patent Number: 5,894,135
[45] Date of Patent: Apr. 13, 1999

[54] SUPERCONDUCTOR DEVICE

[75] Inventors: Tetsuya Yamamoto; Hiroshi Suzuki; Kazuhiko Takahashi, all of Tsukuba; Kenichi Kawaguchi, Tokyo; Seiji Suzuki, Tsukuba; Yorinobu Yoshisato, Inashiki-gun, all of Japan

[73] Assignee: Sanyo Electric Co., Ltd., Osaka, Japan

[21] Appl. No.: 08/732,848

[22] Filed: Oct. 15, 1996

[30] Foreign Application Priority Data

Oct. 16, 1995 [JP] Japan .................................... 7-266843
Mar. 25, 1996 [JP] Japan .................................... 8-068379

[51] Int. Cl.⁶ .................................................. H01L 29/06

[52] U.S. Cl. ................. 257/29; 257/30; 257/197; 257/472; 257/661

[58] Field of Search ...................... 257/26, 27, 29, 257/30, 197, 200, 471, 485, 472, 661

[56] References Cited

U.S. PATENT DOCUMENTS 4,970,395 11/1990 Kruse, Jr. .......................... 250/336.2
5,455,451 10/1995 Usagawa et al. .................... 257/661

OTHER PUBLICATIONS

Kazuhiko Takahashi, et al., "Improvement of the Base/Collector Interface in Superconducting-Base Transistors".

*Primary Examiner*—Sara Crane
*Attorney, Agent, or Firm*—Loeb & Loeb LLP

[57] ABSTRACT

A superconductor device comprises a Schottky barrier region $S_B$ for selectively passing injected carriers and a collector barrier region $L_B$ for selectively blocking leakage carriers. The Schottky barrier region is formed in a low permittivity region $\epsilon_L$ between the first operating region (B) made of superconductor material and the second operating region (C) made of either semiconductor material or metallic material. A resonance region R is formed in the low permittivity region $\epsilon_L$.

14 Claims, 5 Drawing Sheets

BARRIER HEIGHT IN LEAKAGE
CARRIER BARRIER REGION EC2 (meV)

SUPERCONDUCTOR DEVICE

BACKGROUND OF THE INVENTION

1. Field of the Invention

The present invention relates to a superconductor device. In particular, the superconductor device has an operating region made of superconductor material and an operating region made of either semiconductor or metallic material.

2. Description of the Prior Art

A superconductor transistor has been known as a superconductor device having a three-terminal structure (including a device comprising a single element and a device comprising an integrated circuit). The superconductor transistor comprises a semiconductor bipolar transistor having a base region made of superconductor material. In a semiconductor bipolar transistor, the resistance of the base region is critical in determining an operation speed, power consumption, and heat generation. Reduced resistance in the base region will achieve a faster operation speed, reduced power consumption, and lower heat generation. In order to achieve the above, superconductor material is employed for a base region in a superconductor transistor so as to solve technical problems.

As a typical emitter-base structure for a superconductor transistor, a Normal metal Insulator Superconductor (NIS) stacked structure has been known, and a great deal of studies have been made in this direction. In the NIS stacked structure, metallic material, insulator material, and superconductor material are successively stacked, thereby constituting an emitter region, a tunneling barrier region, and a base region, respectively. The collector region of a superconductor transistor employing the NIS stacked structure is made of semiconductor material. This semiconductor material also serves as a substrate of the superconductor transistor.

The base region may be made of BaKBiO-associated superconductor material. Because BaKBiO-associated superconductor material can be formed into a film (hereinafter referred to as a BaKBiO film) at a relatively low temperature, the semiconductor collector region (a semiconductor substrate), on which a BaKBiO film is formed, is not thermally damaged. That is, the use of BaKBiO-associated superconductor material enables a stacked structure using semiconductor material.

The semiconductor collector region may be made of an SrTiO$_3$ crystal substrate (a single crystal substrate) doped with Nb. An SrTiO$_3$ crystal substrate has a perovskite crystal structure, which is similar to the crystal structure of BaKBiO-associated superconductor material, and a crystal lattice interval ("a" axial length) of an SrTiO$_3$ crystal substrate is approximate to the crystal lattice interval ("a" axial length) of BaKBiO-associated superconductor material. Thus, it is possible to form a BaKBio film on the surface of an SrTiO$_3$ crystal substrate.

In the superconductor transistor employing the foregoing NIS stacked structure, a Schottky barrier region is formed on the collector region side between the base region (BaKBio-associated superconductor) and the collector region (a SrTiO$_3$ crystal substrate), starting at the phase boundary between the two regions. Based on the carriers injected from the emitter region, carriers are transmitted from the base region to the collector region, passing through the Schottky barrier region. Further, based on the carriers injected from the base region to the collector region, collector current accordingly flows. A transmission efficiency of the carriers from the base region to the collector region can be effectively increased by setting a lower and shorter barrier in the Schottky barrier region.

In the above superconductor transistor, however, in cases where a lower and shorter barrier is set in a Schottky barrier region for the purpose of increasing a transmission efficiency, increased number of carriers leak from the base region to the collector region, passing through the Schottky barrier region. As a result, current-voltage characteristics are degraded in a superconductor transistor as leakage current is added to the base-collector current.

SUMMARY OF THE INVENTION

The present invention has been conceived to overcome the above problems, and thus aims to provide a superconductor device having a superior current-voltage characteristic, for increasing injection efficiency of carriers and decreasing leakage carriers.

In order to achieve the above object, according to an invention defined in claim 1, there is provided a superconductor device, comprising: a first operating region made of superconductor material; a second operating region made of either semiconductor material or metallic material; a Schottky barrier region formed on a side of the first operating region between the first and second operating regions, through which injection carriers are selectively transmitted from the first operating region to the second operating region; and a collector barrier region formed between the Schottky barrier region and the second operating region, for selectively blocking the injection carriers which leak from the first operating region to the second operating region.

With this arrangement, leakage carriers from the first operating region to the second operating region can be selectively blocked in the collector barrier region. Thus, a Schottky barrier can be formed having a short length without the need to block leakage carriers with a long barrier. As a result, injection efficiency and a transmission efficiency of carriers injected from the first operating region to the second operation region can both be improved.

According to an invention defined in claim 2, in a superconductor device according to claim 1, a barrier length of the collector barrier region is set to be longer than that in the Schottky barrier region, and a barrier height of the collector barrier region is set to be lower than that in the Schottky barrier region.

With this arrangement, since a low barrier is established in the collector barrier region of the superconductor device, injected carriers can reach the second operating region without being blocked.

According to an invention defined in claim 3, in a superconductor device according to claim 2, the Schottky barrier region is formed in a degenerate semiconductor material, and the collector barrier region is made of either degenerate semiconductor material or insulating material.

With this arrangement, when the first operating region (a superconductor region) and the degenerate semiconductor region constitute a junction, a Schottky barrier region is formed on the degenerate semiconductor side between those two regions, starting at the junction surface. In the present invention, the collector barrier region is made of either degenerate semiconductor material or insulating material. Thus, by simply arranging two materials respectively comprising degenerate semiconductor material and degenerate semiconductor or insulating material between the first and second operating regions, it is possible to achieve formation of a compound barrier structure consisting of a Schottky barrier region and a collector barrier region.

According to an invention defined in claim 4, in a superconductor device according to claim 2, the Schottky barrier region, the collector barrier region, and the second operating region are respectively made of degenerate semiconductor material, at least the degenerate semiconductor material in which the Schottky barrier is formed and the degenerate semiconductor material which constitutes the second operating region are doped with impurities for acquiring semiconducting characteristics, and the degenerate semiconductor material in which the Schottky barrier region is formed is set to be doped with impurities at a higher concentration than that at which the degenerate semiconductor which constitutes the second operating region is doped with impurities.

With this arrangement, since a Schottky barrier is formed in a degenerate semiconductor material doped with impurities at a high concentration, a short barrier is established in the Schottky barrier region, so that a transmission efficiency of injected carriers is increased. Moreover, since the Schottky barrier region, the collector barrier region, and the second operating region are all made of similar degenerate semiconductor material, a compound barrier structure and a stacked layer structure for the second operating region can be easily constituted. Further more, since a compound barrier structure can be easily made through formation of two degenerate semiconductor layers on the second operating region using the same film formation device, a production process for the device can be simplified.

According to an invention defined in claim 5, in superconductor device according to claim 4, the collector barrier region is set to be doped with impurities at a lower concentration than that at which the degenerate semiconductor material in which the Schottky barrier region is formed and the degenerate semiconductor material which constitutes the second operating region are doped with impurities.

With this arrangement, in addition to the advantage obtained according to the invention defined in claim 4, other advantages can be achieved, including that a compound barrier structure can be easily achieved since the Schottky barrier region, the collector barrier region and the second operating region are all made of similar degenerate semiconductor material, and formation of the respective regions is controlled through the concentration at which impurities are doped into the degenerate material.

According to an invention defined in claim 6, in a superconductor device according to claim 3, the degenerate semiconductor material in which the Schottky barrier region is formed is set to have smaller permittivity than that of the degenerate semiconductor material which constitutes the collector barrier region.

With this arrangement, when applied to between the first and second operating regions, the device driving voltage is collectively applied to the Schottky barrier region with small permittivity, whereby a potential energy in terms of an energy band structure of the Schottky barrier region is varied. That is, influence caused by the device driving voltage can be absorbed by the Schottky barrier region. As a result, a barrier having a flat height is established over the entire length thereof in the collector barrier region. In other words, the height of the barrier does not vary over the entire barrier length. In this way, a sufficiently long barrier can be established in the collector barrier region, so that blocking capability against leakage carriers can be improved.

According to an invention defined in claim 7, in a superconductor device according to any one of claims 1 to 6, a resonance region is formed, consisting of a quantum potential well, between the Schottky barrier region and the collector barrier region.

With this arrangement, a resonance tunnel effect is produced within the resonance region in the superconductor device. That is, a resonance level occurs within the resonance region, resonating with waves of injected carriers passing through the Schottky barrier region. Since injected carriers can be easily transmitted in the resonance level, a transmission efficiency of injected carriers from the first operating region to the second operating region can be improved.

According to an invention defined in claim 8, in a superconductor device according to any one of claims 1 to 7, the first operating region is used as a base region, and the second operating region is used as a collector region, the superconductor device being a superconductor transistor having a three-terminal construction.

With this arrangement, there can be provided a superconductor transistor with an improved transmission efficiency of carriers injected from a base region to a collector region and an improved blocking capability against carriers leaking from the base region to the collector region. Moreover, in this superconductor transistor, the improvement of a transmission efficiency of injected carriers makes it possible to improve a current amplification factor ($h_{FE}$).

According to an invention defined in claim 9, in a superconductor device according to claim 8, the superconductor transistor includes a third operating region as an emitter region, and a tunneling barrier region is formed between the first and third operating regions.

With this arrangement, there can be provided a superconductor transistor having a three-terminal structure including a base region (a first operating region), a collector region (a second operating region), and an emitter region (a third operating region).

According to an invention defined in claim 10, in a superconductor device according to claim 4, the first operating region is made of either BaKBiO-associated superconductor material or BaRbBiO-associated superconductor material, and the second operating region, the Schottky barrier region, and the collector barrier region are respectively made of $SrTiO_3$.

With this arrangement, BaKBiO-associated semiconductor material or BaRbBiO-associated superconductor material, whose crystal growth temperature is as low as approx. 400° C., can be employed. Thus, when forming a BaKBiO material or a BaRbBiO material on the surface of a $SrTiO_3$ material, the $SrTiO_3$ material is not thermally damaged.

According to an invention defined in claim 11, in a superconductor device according to claim 10, the collector barrier region has a barrier having a length of 120 Å or more.

With this arrangement, the ratio of leakage current to an emitter current can be suppressed to below 0.1%.

According to an invention defined in claim 12, in a superconductor device according to claim 10, the collector barrier region has a barrier having a length of 200 Å or more.

With this arrangement, the ratio of leakage current to an emitter current can be suppressed to an almost negligible value, which can realize a favorable device characteristic.

According to an invention defined in claim 13, in a superconductor device according to claim 7, the first operation region is made of either BaKBiO-associated superconductor material or BaRbBiO-associated superconductor material, the second operating region, the Schottky barrier region, and the collector barrier region are respectively made of $SrTiO_3$, and La or Nb is doped into a $SrTiO_3$ material constituting the Schottky barrier region as impurities so that the Schottky barrier region acquires semiconductor characteristics.

With this arrangement, La or Nb can be doped into $SrTiO_3$ constituting the Schottky barrier region at a high concentration. La, in particular, can be doped at a higher concentration than Nb. Doping La or Nb at a higher concentration can allow establishment of a short barrier in the Schottky barrier region, and that makes it possible to improve a transmission efficiency of injected carriers.

BRIEF DESCRIPTION OF THE DRAWINGS

The above and the other objects, features, and advantages will be further apparent from the following description of the preferred embodiment taken in conjunction with the accompanying drawings wherein.

DESCRIPTION OF THE PREFERRED EMBODIMENTS

A preferred embodiment of the present invention will next be described, wherein the present invention is applied to a superconductor transistor having a three-terminal structure.

Figure 1:
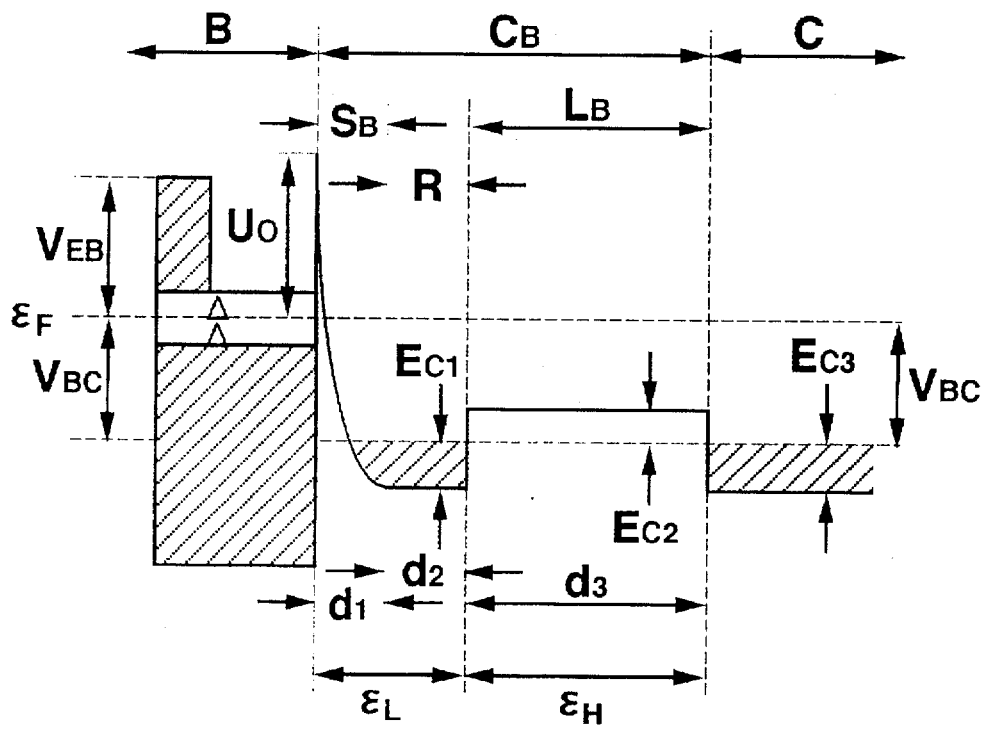
FIG. 1 is a diagram showing an energy band structure of a superconductor transistor having a three-terminal structure according to a preferred embodiment of the present invention.

FIG. 1 illustrates an energy band structure of a superconductor transistor having a three-terminal structure according to a preferred embodiment of the present invention. The superconductor transistor of this embodiment comprises three operation regions, namely an emitter region E (not shown), a base region B, and a collector region C. The base region B is basically made of superconductor material, while the collector region C is basically made of metallic material or degenerate semiconductor material which is very similar to metal in terms of the conduction band.

FIG. 1 includes a Fermi energy level $\epsilon_F$, an emitter E-base B voltage $V_{EB}$, a base B-collector C voltage $V_{BC}$, an energy gap $\Delta$ of the superconductor material constituting the base region B, and a conduction band potential energy level $E_{C3}$ of the collector region C.

In a superconductor transistor according to the preferred embodiment, a low permittivity region $\epsilon_L$ and a high permittivity region $\epsilon_L$ are formed between the base region B and the collector region C, resulting in the formation of a compound barrier region (a compound barrier structure) $C_B$. The compound barrier region $C_B$ consists mainly of a Schottky barrier region $S_B$ and a collector barrier region (a collector buffer region) $L_B$.

The Schottky barrier region $S_B$ of the compound barrier region $C_B$ is formed between the base region B and the collector region C, starting at the phase boundary between the base region B and the low permittivity region $\epsilon_L$ in the direction of the low permittivity region in $\epsilon_L$. FIG. 1 further includes the barrier height $U_o$ of the Schottky barrier region $S_B$ from the Fermi energy level $\epsilon_F$, and the barrier length $d_1$ thereof. Injected from the emitter region E, carriers are transmitted from the base region B to the collector region C via the Schottky barrier region $S_B$. Collector current is caused based on the injected carriers.

The collector barrier $L_B$ is formed in the high permittivity region $\epsilon_H$ which is formed between the Schottky barrier region $S_B$ and the collector region C. FIG. 1 further includes the barrier height $E_{C2}$ of the collector barrier region $L_B$ from the Fermi energy level $\epsilon_F$ (a conductor band potential energy level), and the barrier length $d_3$ thereof. In the collector barrier region $L_B$, carriers are blocked from leaking from the base region B into the collector region C via the Schottky barrier region $S_B$. That is, the collector barrier region $L_B$ can selectively pass carriers injected from the base region B to the collector region C and, at the same time, can selectively block leakage carriers that would otherwise turn into unnecessary current components.

The low permittivity region $\epsilon_L$ is made of either metallic or degenerate semiconductor material, while the high permittivity region $\epsilon_H$ is made of either insulating or degenerate semiconductor material. In a superconductor transistor according to this preferred embodiment, the low and high permittivity regions $\epsilon_L$ and $\epsilon_H$ are both made of degenerate semiconductor material, in which permittivities thereof are controlled through the amount of impurities to be doped into the material. For instance, degenerate semiconductor material doped with impurities at a high concentration has a low permittivity, constituting a low permittivity region $\epsilon_L$, while degenerate semiconductor material doped with impurities at a low concentration or doped with no impurities has a high permittivity, constituting a high permittivity region $\epsilon_H$. In this embodiment, relative permittivity of the low permittivity region $\epsilon_L$ is set at 10, for instance, while that of the high permittivity region $\epsilon_H$ is set at 1000.

In the low permittivity region $\epsilon_L$, a resonance region R is formed, comprising a quantum potential well, between the Schottky barrier region $S_B$ and the collector barrier region $L_B$. In the resonance region R, a resonance level occurs to resonate with the waves of injected carriers passing through the Schottky barrier region $S_B$, so that injected carriers can easily travel through the resonance region R. As a result, a transmission efficiency of the injected carries from the base region B to the collector region C is increased in a superconductor transistor, which also increases collector current, resulting in an improved current amplification factor ($h_{FE}$). FIG. 1 further includes a conduction band potential position level $E_{C1}$ of the resonance region R and the length $d_2$ thereof.

Characteristics of the collector barrier region $L_B$ of the compound barrier region $C_B$ in the superconductor transistor will next be described.

Figure 2:
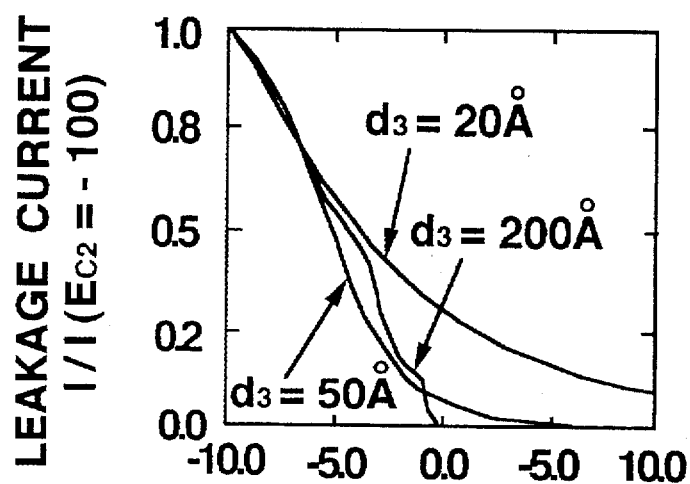
FIG. 2 illustrates the relationship between the height and the length of a collector barrier region and leakage current.

FIG. 2 shows the relationship between the barrier height (a conduction band potential energy level) $E_{C2}$ and the length $d_3$ of the collector barrier region $L_B$ and leakage current, wherein the horizontal axis indicates the barrier height $E_{C2}$ of the collector barrier region $L_B$, and the vertical axis indicates, the amount of leakage current. A Fermi energy level $\epsilon_F$, the barrier height $U_o$ and length $d_1$ of the Schottky barrier region $S_B$, the conduction band potential energy level $E_{C1}$ and length $d_2$ of the resonance region R, and the conduction band potential energy level $E_{C3}$ of the collector region C respectively take the following values:

Fermi energy level $\epsilon_F$: 1 eV barrier height $U_0$: 100 meV barrier length $d_1$: 10 Å conduction band potential energy level $E_{C1}$: 10 meV (positive in the downward direction)

length $d_2$ of the resonance region R : 10 Å conduction band potential energy level $E_{C3}$: 10 meV (positive in the downward direction)

The drawing shows cases where a collector carrier region $L_B$ has different barrier lengths $d_3$, namely 20 Å, 50 Å, and 200 Å, under the above condition. In each case, leakage current varies in response to the variation of barrier height $E_{C2}$. As is shown in FIG. 2, a higher barrier (height $E_{C2}$, positive in the upward direction in FIG. 1) and a longer barrier (length $d_3$) in the collector barrier region $L_B$ will reduce leakage current. In cases where the barrier length $d_3$ is set at 200 Å, almost all leakage current can be blocked, provided that the barrier height $E_{C2}$ is set equal to or higher than the Fermi energy level $\epsilon_F$. In cases where the barrier length $d_3$ is excessively longer, however, more than a negligible amount of injected carriers are scattered, which reduces the operation speed of a superconductor transistor. For the above reason, the barrier length $d_3$ of the collector barrier region $L_B$ is set at a dimension, such as at less than 500 Å, such that leakage carriers can be blocked and, at the same time, the transmission efficiency of the injection carriers is not deteriorated.

In cases where the collector barrier region $L_B$ is made of insulating material, the barrier height $E_{C2}$ thereof can be adjusted by using a different insulator material. In cases where the collector barrier region $L_B$ is made of degenerate semiconductor material, the barrier height $E_{C2}$ thereof can be adjusted by using a different degenerate semiconductor material or changing the concentration of impurities to be doped thereto. The barrier length $d_3$ of the collector barrier region $L_B$ can be adjusted by changing the thickness of the insulator/degenerate semiconductor material.

Figure 3:
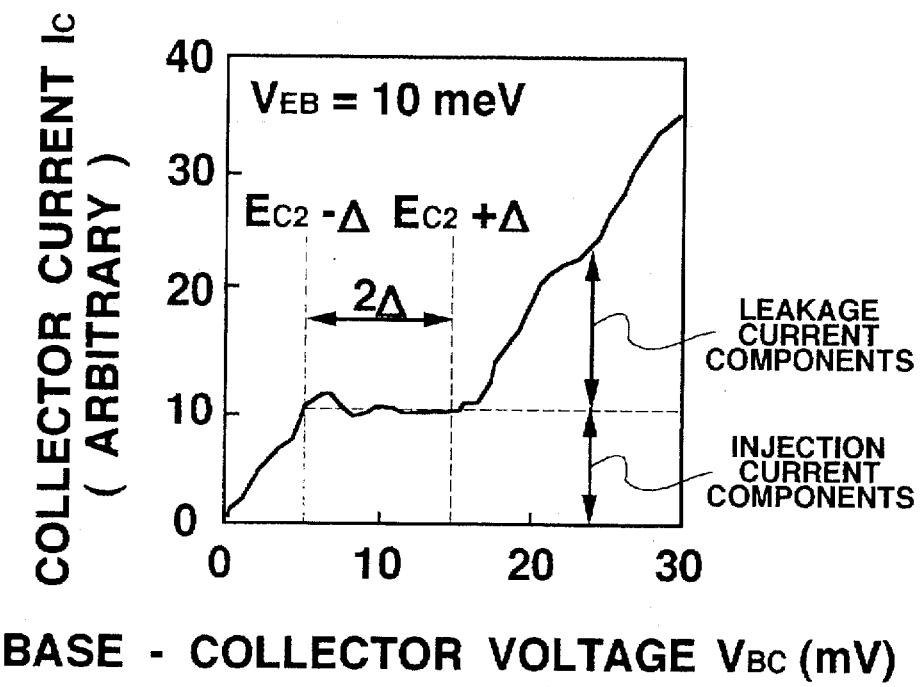
FIG. 3 illustrates the relationship between a base-collector voltage and collector current.

FIG. 3 illustrates the relationship between a base B-collector C voltage $V_{BC}$ and collector current $I_C$ when the barrier height $E_{C2}$ of the collector barrier region $L_B$ is 10 mev, wherein the horizontal axis indicates the base B-collector C voltage $V_{BC}$, and the vertical axis indicates collector current $I_C$ (in arbitrary units). As shown in the drawing, during a low voltage where the base B-collector C voltage $V_{BC}$ is less than $E_{C2}-\Delta$ ($\Delta$ being an energy gap of the superconductor material), collector current $I_C$ increases according to an increase of a base B-collector C voltage $V_{BC}$. In this state, the majority of the leakage carriers are blocked in the collector barrier region $L_B$, so that the collector current $I_C$ rarely contains leakage current components. On the contrary, although the collector current $I_C$ increases according to an increase of a base B-collector C voltage $V_{BC}$ also during a high voltage where the base B-collector C voltage $V_{BC}$ exceeds $E_{C2}+\Delta$, the collector current $I_C$ contains leakage current components which are also increased according to an increase of the base B-collector C voltage $V_{BC}$. In other words, the collector barrier region $L_B$ does not block leakage carriers within this voltage range.

When the base B-collector C voltage $V_{BC}$ is set within the range $E_{C2}-\Delta<V_{BC}<E_{C2}+\Delta$, a constant collector current $I_C$ flows irrespective of an increase/decrease of base B-collector C voltage $V_{BC}$ within the above range. Further, electric current solely corresponding to the injected carriers from the base region B to the collector region C are generated as collector current $I_C$ (in arbitrary units) containing almost no leakage current components.

Figure 4:
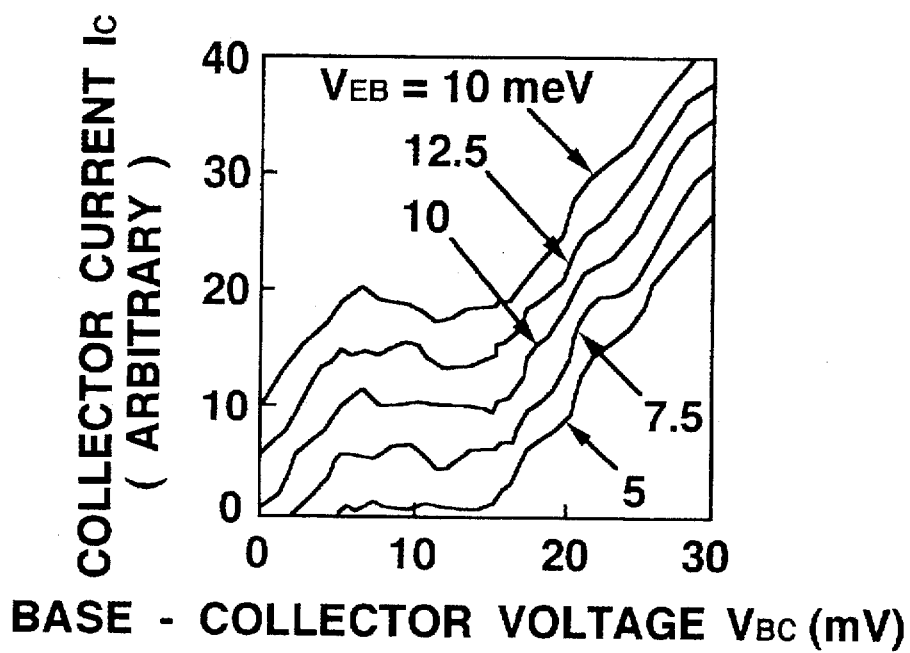
FIG. 4 illustrates the relationship between an emitter-base voltage, a base-collector voltage, and collector current.

FIG. 4 illustrates the relationship between an emitter E-base B voltage $V_{EB}$, a base B-collector C voltage $V_{BC}$, and collector current $I_C$, wherein the horizontal axis indicates the base B-collector C voltage $V_{BC}$, and the vertical axis indicates the collector current $I_C$. As is shown in the drawing, increases of the emitter E-base B voltage $V_{EB}$ and of the base B-collector C voltage $V_{BC}$ will result in an increase of the collector current $I_C$. As described above, when a base B-collector C voltage $V_{BC}$ is set within the range $E_{C2}-\Delta<V_{BC}<E_{C2}+\Delta$, a constant collector current $I_C$ flows irrespective of an increase/decrease of the base B-collector C voltage within the range. The constant collector current $I_C$ can be increased/decreased in response to an increase/decrease of the emitter E-base B voltage $V_{EB}$.

Figure 5A:
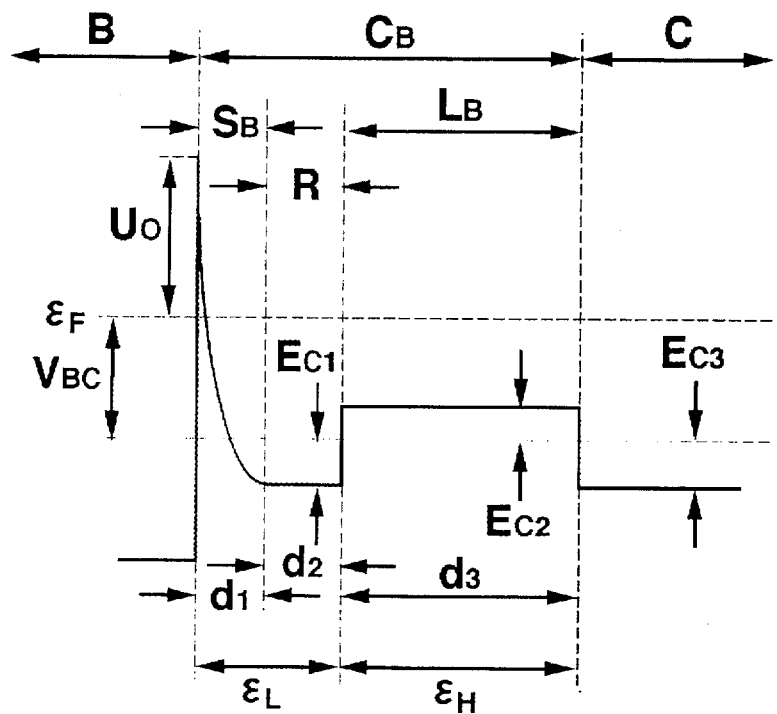
FIG. 5A is a schematic representation of an energy band structure of a superconductor transistor.

FIG. 5A is a schematic representation of an energy band structure of a superconductor transistor according to the preferred embodiment of the present invention. In the drawing, as described above, a low permittivity region $\epsilon_L$ and a high permittivity region $\epsilon_H$ are formed between the base region B and the collector region C, resulting in formation of a compound barrier region $C_B$. The base B-collector C voltage $V_{BC}$ is collectively applied to the low permittivity region $\epsilon_L$ since the low permittivity region $\epsilon_L$ is formed, starting at the junction surface of the superconductor base region B closer to the collector base region C. As a result, the barrier height $E_{C2}$ of the collector barrier region $L_B$ can be kept constant over the entire barrier length $d_3$ thereof, although it varies slightly according to an increase/decrease of the base B-collector C voltage $V_{BC}$. In other words, a sufficiently long and high barrier can be established over the entire collector barrier region $L_B$, so that leakage carriers can be more efficiently blocked.

Figure 6:
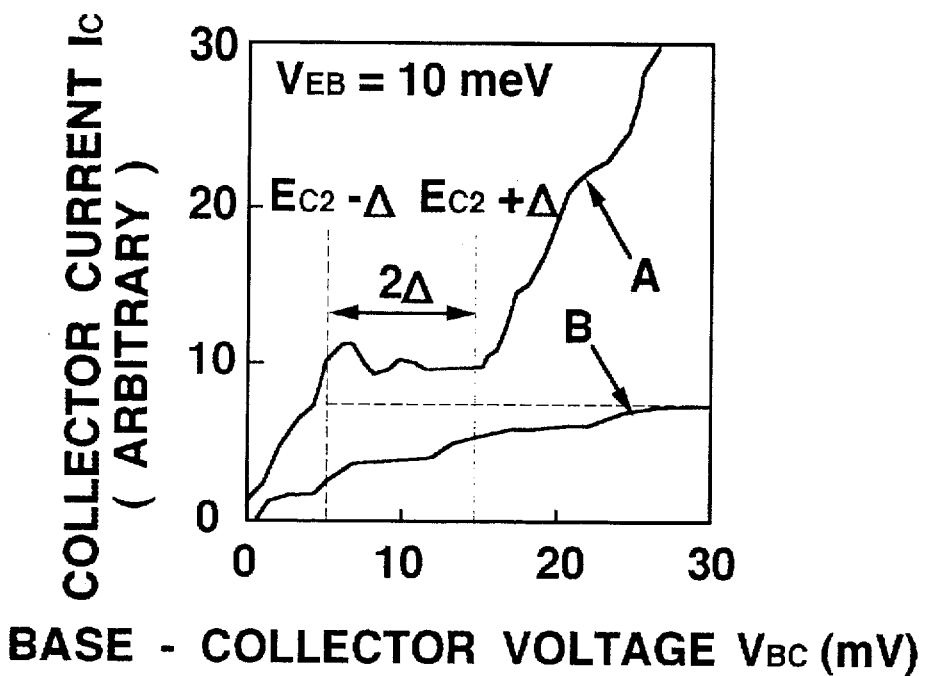
FIG. 6 illustrates the relationship between a base-collector voltage and collector current.

FIG. 6 illustrates the relationship between a base B-collector C voltage $V_{BC}$ and collector current $I_C$ in a superconductor transistor (line A) comprising a compound barrier range $C_B$ where low and high permittivity regions $\epsilon_L$ and $\epsilon_H$ are formed. In the drawing, the horizontal axis indicates a base B-collector C voltage $V_{BC}$, and the vertical axis indicates collector current $I_C$ (in arbitrary units). As is apparent from the drawing, the same characteristics as those shown in FIGS. 3 and 4 are obtained, in which constant collector current $I_C$ is generated when the base B-collector C voltage $V_{BC}$ is set within the range $E_{C2}-\Delta<V_{BC}<E_{C2}+\Delta$.

Figure 5B:
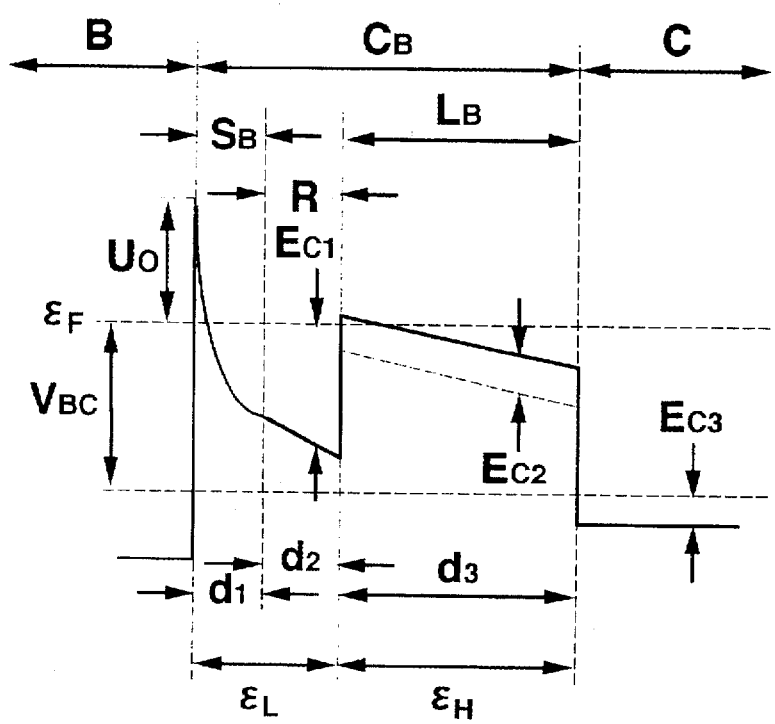
FIG. 5B is a schematic representation of an energy band structure of a superconductor transistor.

FIG. 5B is a schematic representation of a band structure of a superconductor transistor, wherein its low permittivity region $\epsilon_L$ does not substantially function as it should do due to too small a difference in permittivity between the low and high permittivity regions $\epsilon_L$ and $\epsilon_H$. Such a case is almost equivalent to cases where a low permittivity region $\epsilon_L$ is hardly formed on the junction surface of the superconductor base region B closer to the collector region C, in which a base B-collector C voltage $V_{BC}$ is applied not only to the low permittivity region $\epsilon_L$ but also to the high permittivity region $\epsilon_H$. In such a case, the shape of the barrier in the collector barrier region $L_B$ is deformed due to application of the base B-collector C voltage $V_{BC}$ to the high permittivity region $\epsilon_H$ such that the flat region (height $E_{C2}$) of the barrier is inclined over the entire barrier length $d_3$. That is, the barrier is high on the base region B side and low on the collector region C side. This makes it difficult to establish a sufficiently long and high barrier, resulting in deterioration of blocking capability against leakage carriers. FIG. 6 also illustrates the relationship between a base B-collector C voltage $V_{BC}$ and collector current $I_C$ for a superconductor transistor where a low permittivity region $\epsilon_L$ is not formed in a compound barrier region $C_B$ (line B). As is shown in the drawing, the collector current $I_C$ increases according to an increase of the base B-collector C voltage $V_{BC}$, though the collector current $I_C$ contains leakage current components.

Figure 7:
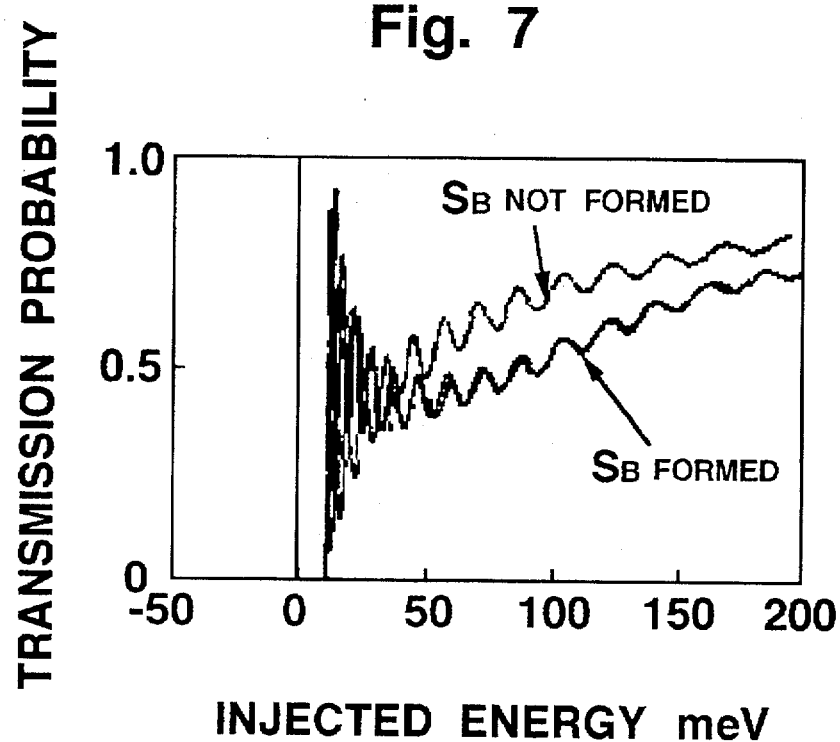
FIG. 7 illustrates the relationship between injected energy and transmission probability in a resonance region R.

FIG. 7 shows the relationship between injected energy and transmission probability in a resonance region R which is formed in a compound barrier region $C_B$ of a superconductor transistor according to this preferred embodiment. In the drawing, the horizontal axis indicates injected energy of carriers injected from the base region B to the collector region C, and the vertical axis indicates transmission probability of the injected carriers in the resonance region R. The result shown in the drawing was obtained under the following condition.

Fermi energy level $\epsilon_F$: 1 eV barrier height $U_o$: 100 meV barrier length $d_1$: 10 Å conduction band potential energy level $E_{C1}$: 10 meV (positive in the downward direction)

length $D_2$ of the resonance region R: 10 Å conduction band potential energy level $E_{C2}$: 10 meV (positive in the upward direction)

barrier length $d_3$: 200 Å conduction band potential energy level $EC_3$: 5 me V (positive in the downward direction)

Under the above conditions, transmission probability tends to increase according to an increase of injected energy in either cases where a Schottky barrier region $S_B$ is formed (a superconductor transistor of this embodiment) or where it is not, as shown in FIG. 7. In cases where the Schottky barrier region $S_B$ is formed, a higher transmission probability is obtained for lower injected energy, compared to the cases where the Schottky barrier region is not formed. That is, when a resonance region R is formed comprising a quantum potential well, a resonance level is generated therein to resonate with specific waves of injected carriers, so that the injected carriers easily pass through the resonance level due to a resonance tunnel effect. As a result, electric current can easily be transmitted from the base region B to the collector region C, whereby a current amplification factor ($h_{FE}$) is increased.

In the resonance region R, it is generally more likely for a resonance tunnel effect to be generated when the thickness of a low permittivity region $\epsilon_L$, that is, an addition of the barrier length $d_1$ of the Schottky barrier region $S_B$ and the length $d_2$ of the resonance region R ($d_1+d_2$), becomes less than 100 Å. The resonance tunnel effect also tends to be more easily generated in a low permittivity region $\epsilon_L$ formed by doping impurities to degenerate semiconductor material at a higher concentration for obtaining favorable conductivity. For instance, in cases where $Sr_{1-x}La_xTiO_3$ (x=0.01–0.05) is used as degenerate semiconductor material and La is used as impurities, La may be doped into the degenerate semiconductor material at the concentration of approx. $10^{21}$ atoms/cm$^3$. $SrTiO_3$ is a typical semiconductor material on which a film of BaKBiO- or BaRbBiO- associated superconductor material can be formed. Nb may be used as impurities, though La is more preferred in the present invention because Nb cannot be doped at a high concentration as the maximum concentration thereof is approx. $10^{18}$ atoms/cm$^3$.

EXAMPLES

Concrete structures and manufacturing methods of the foregoing superconductor transistor will next be described.

Construction

Figure 8:
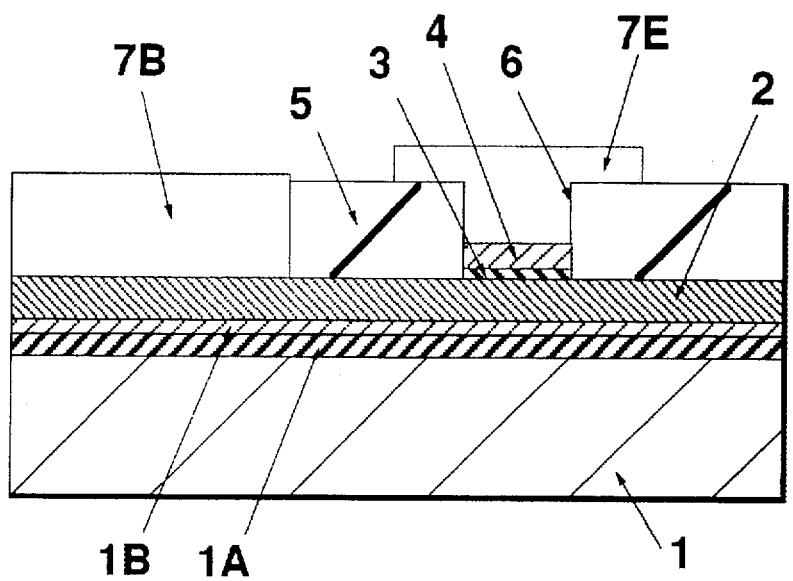
FIG. 8 is a sectional view showing the structure of a superconductor transistor according to the preferred embodiment of the present invention.

FIG. 8 is a sectional view of a superconductor transistor according to a preferred embodiment of the present invention. As shown in the drawing, a superconductor transistor mainly comprises a degenerate semiconductor substrate 1, degenerate semiconductor films 1A and 1B, a superconductor film 2, a tunnel insulator film 3, and a metallic film 4.

The degenerate semiconductor substrate 1, used as a collector region C, may be made of a single crystal substrate of $Sr_{1-x}La_xTiO_3$ (x=0–0.001) with La or Nb doped thereto. La or Nb is doped at a concentration of approx. $10^{19}$ atoms/cm$^3$.

The degenerate semiconductor film 1A, used as a high permittivity region $\epsilon_H$, constitutes a collector barrier region $L_B$ of a compound barrier region $C_B$. The degenerate semiconductor film 1A may be made of a single crystal film of $Sr_{1-x}La_xTiO_3$ (x=0), or the like, wherein the $SrTiO_3$ single crystal film is doped with no impurities or impurities at a very low concentration because the degenerate semiconductor film 1A serves as a high permittivity region $\epsilon_H$.

Figure 9:
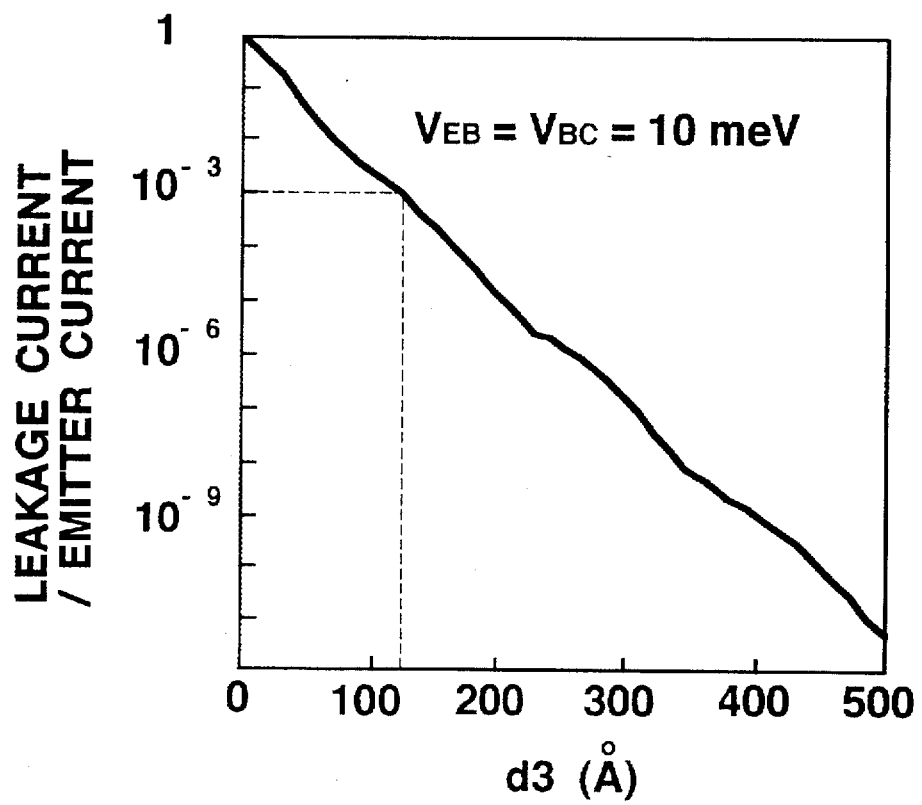
FIG. 9 shows the ratio of leakage current to emitter current with respect to the barrier length of the collector barrier region of a superconductor transistor according to the preferred embodiment of the present invention.

FIG. 9 shows the ratio of leakage current to emitter current when film thickness of the degenerate semiconductor film 1A, that is, the barrier length $d_3$, is varied. As is apparent from FIG. 9, when the barrier length $d_3$ is set over 120 Å, the ratio of leakage current to emitter current can be suppressed to less than $10^{-3}$, that is, 0.1%. More preferably, when a barrier length $d_3$ is set to more than 200 Å, the ratio can be suppressed as low as under $10^{-5}$, where the leakage current is almost negligible. In addition, as described above, the barrier length $d_3$ is preferably set at 500 Å or under so as not to deteriorate a transmission efficiency. Therefore, the degenerate semiconductor film 1A is formed having a thickness of 120 to 500 Å, and more preferably, 200 to 500 Å.

The degenerate semiconductor film 1B, used as a low permittivity region $\epsilon_L$, constitutes the Schottky barrier region $S_B$ and a resonance region R of the compound barrier region $C_B$. A degenerate semiconductor film 1B may be made of a $Sr_{1-x}La_xTiO_3$ (x=0.01–0.05) single crystal film, wherein the $SrTiO_3$ single crystal film is doped at a high concentration because the degenerate semiconductor film 1A serves as a low permittivity region $\epsilon_H$. La and Nb both can be used as impurities, though La is used in this embodiment as La can be doped at a higher concentration than Nb. La can be doped at a concentration of approx. $10^2$ atoms/cm$^3$, as described above. The degenerate semiconductor film 1B is formed having a film thickness of approx. 10 to 100 Å.

The superconductor film 2, used as a base region B, may be made of $Sr_{1-x}La_xTiO_3$ (x=0.2–0.5) superconductor material. As a $BaKBiO_3$-associated superconductor material can be formed into a film at as low as approx. 400° C., the degenerate semiconductor film 1B, serving as a base, is not thermally damaged when a $BaKBio_3$ film is formed thereon. BaRbBiO-associated superconductor material, also having a low film formation temperature, may also be employed. The superconductor film 2 is formed having a thickness of approx. 200 nm.

The tunnel insulator film 3 is formed as a tunneling barrier region between the emitter region E and the base region B.

The tunnel insulator film 3 may be formed either naturally (a natural barrier) or artificially (an artificial barrier). In this embodiment, MgO is employed to form an artificial tunnel insulator film 3. The tunnel insulator film 3 is formed having, for instance, a film thickness of 10 to 50 Å.

The degenerate semiconductor film 4, used as an emitter region E, may be made of Au, or the like.

FIG. 8 shows an insulator film 5, a through-hole 6 formed on the insulator film 5, a base electrode 7B, and an emitter electrode 7E. The base and emitter electrodes 7B and 7E are made of Au, or the like.

PRODUCTION METHOD

A production method of the above superconductor transistor will be briefly explained.

First prepared is a degenerate semiconductor substrate (a $SrLaTiO_3$ single crystal substrate) 1. A degenerate semiconductor films ($SrLaTiO_3$) 1A and 1B are then successively stacked on the degenerate semiconductor substrate 1 using a molecular beam epitaxy method (MBE). Conditions for the above film formation are set as follows: a substrate temperature at 300 to 600° C., a film formation temperature at 300 to 600° C., and a growth speed at 0.1 to 10 Å/sec. The La concentration is controlled during film formation.

A superconductor ($BaKBiO_3$ superconductor) film 2 is formed on the surface of the degenerate semiconductor film 1B, using a high frequency magnetron sputtering method, or the like. In this event, $BaKBiO_3$ powder is hardened through pressing and then used as a sputtering target. Conditions for the above film formation are set as follows: vacuum pressure at $1 \times 10^{-5}$ Pa, a substrate temperature at 300 to 400° C., a gas flow ratio of sputtering gas $O_2$ and Ar at 1:1, gas pressure at 80 Pa, high frequency output at 100 W, a deposition speed at 0.1 Å/sec, and a deposition time at 2000 seconds. Under the above conditions, a $BaKBiO_3$ superconductor film is formed having a film thickness of 200 nm.

APPLIED EXAMPLE

The superconductor film 2, serving as a base region B, of the foregoing superconductor transistor according to the present invention may be made any of lanthanum-, yttrium-, bismuth-, thallium-, lead-, electronic-, or nickel-associated superconductor material.

Further, the junction structure between an emitter region E and a base region B may be constructed in a Superconductor Insulator Superconductor (SIS) structure.

Still further, the present invention may be applied to a device having a junction construction between a superconductor material and a semiconductor/metallic material, such as a diode, a thyristor, or the like.

As described above, according to the present invention, there can be provided a superconductor device having a superior current-voltage characteristic, achieving enhanced carrier injection efficiency and reduced leakage carriers.

What is claimed is:

1. A superconductor device, comprising:

a first operating region made of superconductor material;

a second operating region made of either semiconductor material or metallic material;

a Schottky barrier region formed on a side of the first operating region between the first and second operating regions, through which injection carriers are selectively transmitted from the first operating region to the second operating region; and a collector barrier region formed between the Schottky barrier region and the second operating region, for selectively blocking the injection carriers which leak from the first operating region to the second operating region;

wherein the Schottky barrier region is set to have smaller permittivity than that of the collector barrier region.

2. A superconductor device according to claim 1, wherein a barrier length of the collector barrier region is set to be longer than that in the Schottky barrier region, and a barrier height of the collector barrier region is set to be lower than that in the Schottky barrier region.

3. A superconductor device according to claim 2, wherein, the Schottky barrier region is formed in a degenerate semiconductor material, and the collector barrier region is made of either degenerate semiconductor material or insulating material.

4. A superconductor device according to claim 2, wherein the Schottky barrier region, the collector barrier region, and the second operating region are respectively made of degenerate semiconductor material, at least the degenerate semiconductor material in which the Schottky barrier is formed and the degenerate semiconductor material which constitutes the second operating region are doped with impurities for acquiring semiconducting characteristics, and the degenerate semiconductor material in which the Schottky barrier region is formed is set to be doped with impurities at a higher concentration than that at which the degenerate semiconductor which constitutes the second operating region is doped with impurities.

5. A superconductor device according to claim 4, wherein the collector barrier region is set to be doped with impurities at a lower concentration than that at which the degenerate semiconductor material in which the Schottky barrier region is formed and the degenerate semiconductor material which constitutes the second operating region are doped with impurities.

6. A superconductor device according to any one of claims 1 to 5, wherein a resonance region is formed, consisting of a quantum potential well, between the Schottky barrier region and the collector barrier region.

7. A superconductor device according to claim 1, wherein the first operating region is used as a base region, and the second operating region is used as a collector region, the superconductor device being a superconductor transistor having a three-terminal construction.

8. A superconductor device according to claim 7, wherein the superconductor transistor includes a third operating region as an emitter region, and a tunnel region is formed between the first and third operating regions.

9. A superconductor device according to claim 4, wherein the first operating region is made of either BaKBiO-associated superconductor material or BaRbBiO-associated superconductor material, and the second operating region, the Schottky barrier region, and the collector barrier region are respectively made of $SrTiO_3$.

10. A superconductor device according to claim 9, wherein the collector barrier region has a barrier having a length of 120 Å or more.

11. A superconductor device according to claim 9, wherein the collector barrier region has a barrier having a length of 200 Å or more.

12. A superconductor device according to claim 6, wherein
the first operation region is made of either BaKBiO-associated superconductor material or BaRbBiO-associated superconductor material,
the second operating region, the Schottky barrier region, and
the collector barrier region are respectively made of $SrTiO_3$, and
La or Nb is doped into a $SrTiO_3$ material constituting the Schottky barrier region as impurities so that the Schottky barrier region acquires semiconductor characteristics.

13. A superconductor device according to claim 1, wherein the barrier height of the collector region is set to become substantially constant over the entire barrier length thereof.

14. A superconductor device according to claim 6, wherein the resonance region improves a transmission efficiency of injected carriers from the first operating region to the second operating region.

* * * * *